(12) United States Patent
Gong et al.

(10) Patent No.: US 11,985,885 B2
(45) Date of Patent: May 14, 2024

(54) ARRAY SUBSTRATE INCLUDING PHOTOSENSITIVE ELEMENT AND DISPLAY PANEL

(71) Applicant: WUHAN CHINA STAR OPTOELECTRONICS TECHNOLOGY CO., LTD., Wuhan (CN)

(72) Inventors: Fan Gong, Wuhan (CN); Fei Ai, Wuhan (CN); Jiyue Song, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 499 days.

(21) Appl. No.: 17/287,169

(22) PCT Filed: Apr. 14, 2021

(86) PCT No.: PCT/CN2021/087294
§ 371 (c)(1),
(2) Date: Apr. 21, 2021

(87) PCT Pub. No.: WO2022/198726
PCT Pub. Date: Sep. 29, 2022

(65) Prior Publication Data
US 2023/0137922 A1    May 4, 2023

(30) Foreign Application Priority Data
Mar. 26, 2021    (CN) .......... 202110324963.7

(51) Int. Cl.
*H10K 59/60*    (2023.01)
*G02F 1/1362*    (2006.01)
*H10K 59/80*    (2023.01)

(52) U.S. Cl.
CPC ....... *H10K 59/60* (2023.02); *G02F 1/136209* (2013.01); *H10K 59/879* (2023.02); *H10K 59/8792* (2023.02)

(58) Field of Classification Search
CPC . H10K 59/60; H10K 59/879; G02F 1/136209
(Continued)

(56) References Cited

U.S. PATENT DOCUMENTS

2009/0267121 A1    10/2009   Ishida et al.
2011/0024739 A1    2/2011    Shu et al.
(Continued)

FOREIGN PATENT DOCUMENTS

CN    106684202 A    5/2017
CN    107221575 A    9/2017
(Continued)

*Primary Examiner* — Quoc D Hoang
(74) *Attorney, Agent, or Firm* — The Roy Gross Law Firm, LLC; Roy Gross

(57) ABSTRACT

An array substrate, a manufacturing process of an array substrate, and a display panel are disclosed. The array substrate includes a substrate and a photosensitive element. The photosensitive element is disposed on the substrate and includes a doped semiconductor layer, an intrinsic semiconductor layer, and a transparent electrode layer sequentially stacked. By improving an internal structure of the photosensitive element, light absorption by an incident interface of the intrinsic semiconductor layer can be increased, so that sensitivity of the photosensitive element is enhanced.

20 Claims, 6 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2014/0144502 A1* | 5/2014 | Nakagawa | .......... | H01L 31/0322 |
| | | | | 438/95 |
| 2021/0200366 A1* | 7/2021 | Bok | ..................... | H10K 59/122 |
| 2021/0320217 A1* | 10/2021 | Levy | ..................... | H01L 31/028 |

FOREIGN PATENT DOCUMENTS

| | | | |
|---|---|---|---|
| CN | 108198894 | A | 6/2018 |
| CN | 108447937 | A | 8/2018 |
| CN | 109244174 | A | 1/2019 |
| CN | 109686808 | A | 4/2019 |
| CN | 109935602 | A | 6/2019 |
| CN | 110135388 | A | 8/2019 |
| CN | 209592040 | U | 11/2019 |
| CN | 110678983 | A | 1/2020 |
| CN | 110718565 | A | 1/2020 |
| CN | 111898506 | A | 11/2020 |
| CN | 112420607 | A | 2/2021 |
| IN | 112259556 | A | 1/2021 |
| TW | 201100934 | A | 1/2011 |

* cited by examiner

ARRAY SUBSTRATE INCLUDING PHOTOSENSITIVE ELEMENT AND DISPLAY PANEL

CROSS REFERENCE TO RELATED APPLICATIONS

This application is a National Phase of PCT Patent Application No. PCT/CN2021/087294 having International filing date of Apr. 14, 2021, which claims the benefit of priority of Chinese Application No. 202110324963.7 filed Mar. 26, 2021. The contents of the above applications are all incorporated by reference as if fully set forth herein in their entirety.

BACKGROUND OF INVENTION

1. Field of Invention

The present invention relates to a technical field of displays, and particularly to, an array substrate, a manufacturing process of an array substrate, and a display panel.

2. Related Art

With rapid development of panel industries, people have put forward other requirements for display panels in addition to high resolutions, wide viewing angles, and low power consumption. Enriching panel functions, increasing human-computer interaction, and improving competitiveness of display panels are currently one of the main development directions of display panels.

Optical fingerprints, ambient light sensors, and other light-sensitive components (sensors) are hot in current development. A manufacturing process currently carried out by panel manufacturers is to use polysilicon (poly-Si) to make light-absorbing layers of photosensitive sensors, but thickness of poly-Si photosensitive sensors is too thin to absorb enough light intensity, which will adversely affect sensitivity of photosensitive sensors. Monocrystalline silicon ($\alpha$-Si), as a visible light absorbing material, has an advantage of controllable thickness, and is a better choice as light absorbing layers of photosensitive sensors.

At present, photosensitive sensors integrated into array substrates are constructed with P-$\alpha$-Si/n-poly-Si heterojunction structure or P-$\alpha$-Si/intrinsic $\alpha$-Si/n-poly-Si structure. Since the P-$\alpha$-Si structure grown by ion implantation or plasma enhanced chemical vapor deposition (PECVD) is at a tip of incident light, away from junction areas of the heterojunction, magnetic fields being generated are weak, and thus photo-generated electrons and holes cannot be effectively separated, thereby seriously affecting sensitivity of the photosensitive sensors.

SUMMARY OF INVENTION

An object of the present invention is to provide an array substrate, a manufacturing process of an array substrate, and a display panel, to enhance sensitivity of a photosensitive element by improving a structure of the photosensitive element.

To achieve the above-mentioned object, the present invention provides an array substrate, comprising a substrate; a photosensitive element disposed on the substrate and comprising a doped semiconductor layer, an intrinsic semiconductor layer, and a transparent electrode layer sequentially stacked; wherein the doped semiconductor layer is an N-type doped semiconductor, and the transparent electrode layer is a P-type transparent electrode, or the doped semiconductor layer is a P-type doped semiconductor, and the transparent electrode layer is an N-type transparent electrode.

In one embodiment of the present invention, the transparent electrode layer has a thickness between 500 angstroms (Å) and 800 Å.

In one embodiment of the present invention, the transparent electrode layer is made of metal oxide.

In one embodiment of the present invention, a light shielding layer and a buffer layer are disposed between the substrate and the doped semiconductor layer, wherein the light shielding layer is disposed on a side surface of the substrate and partially covers the substrate, the buffer layer is disposed on a side of the light shielding layer away from the substrate and extends to the substrate, and the photosensitive element is disposed on a side of the buffer layer away from the substrate and is located in an area within an orthographic projection off the light shielding layer on the substrate.

In one embodiment of the present invention, the doped semiconductor layer is made of polysilicon, and the intrinsic semiconductor layer is made of amorphous silicon.

In one embodiment of the present invention, the array substrate further comprises a first insulating layer and a second insulating layer, wherein the first insulating layer is disposed on a side of the doped semiconductor layer away from the substrate and extends to the buffer layer, and a first via hole is defined in the first insulating layer; wherein the intrinsic semiconductor layer is disposed on a side of the first insulating layer away from the substrate and is connected to the doped semiconductor through the first via hole; the second insulating layer is disposed on a side of the intrinsic semiconductor layer away from the substrate and extends to the first insulating layer, and a second via hole is defined in the second insulating layer; and the transparent electrode layer is disposed on a side of the second insulating layer away from the doped semiconductor layer and is connected to the intrinsic semiconductor layer through the second via hole.

In one embodiment of the present invention, the array substrate further comprises a metal layer, configured in a same layer as the transparent electrode layer, wherein a third via hole is further defined in the first insulating layer and the second insulating layer, and the metal layer is connected to the doped semiconductor layer through the third via hole.

In one embodiment of the present invention, each of the doped semiconductor layer and the intrinsic semiconductor layer is made of amorphous silicon.

In one embodiment of the present invention, the array substrate further comprises a first insulating layer, and the doped semiconductor layer is disposed on the substrate, the intrinsic semiconductor layer is disposed on a side of the first insulating layer away from the substrate, wherein the first insulating layer is disposed on a side of the intrinsic semiconductor layer away from the substrate and extends to the buffer layer, and a first via hole is defined in the first insulating layer, wherein the transparent electrode layer is disposed on a side of the first insulating layer away from the intrinsic semiconductor layer and is connected to the intrinsic semiconductor layer through the first via hole.

In one embodiment of the present invention, the array substrate further comprises a metal layer, wherein a second via hole is defined in the first insulating layer, and the metal layer is configured in a same layer as the transparent electrode layer and is connected to the doped semiconductor layer through the second via hole.

In one embodiment of the present invention, the buffer layer comprises a silicon nitrogen layer and a silicon oxygen layer sequentially stacked, or a combination thereof.

In one embodiment of the present invention, the doped semiconductor layer has a thickness between 400 Å and 600 Å.

In one embodiment of the present invention, the intrinsic semiconductor layer has a thickness between 1000 Å and 7000 Å.

In one embodiment of the present invention, the doped semiconductor layer has a Fermi level between 4.2 and 4.7, the intrinsic semiconductor layer has a Fermi level between 4.6 and 5.0, and the transparent electrode layer has a Fermi level between 4.9 and 5.5.

In one embodiment of the present invention, the doped semiconductor layer has a refractive index between 3.8 and 4.2, the intrinsic semiconductor layer has a refractive index between 3.6 and 4.1, and the transparent electrode layer has a refractive index between 1.6 and 2.0.

The present invention further provides a display panel, comprising an array substrate, wherein the array substrate comprises a substrate; a photosensitive element disposed on the substrate and comprising a doped semiconductor layer, an intrinsic semiconductor layer, and a transparent electrode layer sequentially stacked; wherein the doped semiconductor layer is an N-type doped semiconductor, and the transparent electrode layer is a P-type transparent electrode, or the doped semiconductor layer is a P-type doped semiconductor, and the transparent electrode layer is an N-type transparent electrode.

In one embodiment of the present invention, the transparent electrode layer has a thickness between 500 angstroms (Å) and 800 Å.

In one embodiment of the present invention, the doped semiconductor layer has a Fermi level between 4.2 and 4.7, the intrinsic semiconductor layer has a Fermi level between 4.6 and 5.0, and the transparent electrode layer has a Fermi level between 4.9 and 5.5.

In one embodiment of the present invention, the display panel further comprises an opposite substrate and a liquid crystal layer, wherein the opposite substrate is disposed opposite to the array substrate, and the liquid crystal layer is disposed between the array substrate and the opposite substrate.

In one embodiment of the present invention, the array substrate comprises the substrate, a light shieling layer, a buffer layer, the doped semiconductor layer, an active layer configured in a same layer as the doped semiconductor layer, a first insulating layer, a gate electrode layer, a second insulating layer, the intrinsic semiconductor layer, a third insulating layer, a source/drain wiring, a planarization layer, a passivation layer, the transparent electrode layer, and a first electrode layer configured in a same layer as the transparent electrode layer all sequentially disposed in a stacked arrangement.

The present invention has advantageous effects as follows: an array substrate provided by the present invention includes a substrate and a photosensitive element. The photosensitive element is disposed on the substrate and includes a doped semiconductor layer, an intrinsic semiconductor layer, and a transparent electrode layer sequentially stacked. The doped semiconductor layer is an N-type doped semiconductor, and the transparent electrode layer is a P-type transparent electrode, or the doped semiconductor layer is a P-type doped semiconductor, and the transparent electrode layer is an N-type transparent electrode. By improving an internal structure of the photosensitive element, light absorption by an incident interface of the intrinsic semiconductor layer can be increased, so that sensitivity of the photosensitive element is enhanced.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

The technical solutions of the present invention will be clearly and completely described below in conjunction with the accompanying drawings in the present invention. Obviously, the described embodiments are only a part of the embodiments of the present invention, rather than all the embodiments. Based on the embodiments of the present invention, other embodiments obtained by those skilled in the art without creative work shall fall within the protection scope of the present invention.

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

The present invention provides an array substrate, a method of manufacturing an array substrate, and a display panel. The following is a detailed description of the array substrate.

Figure 1:
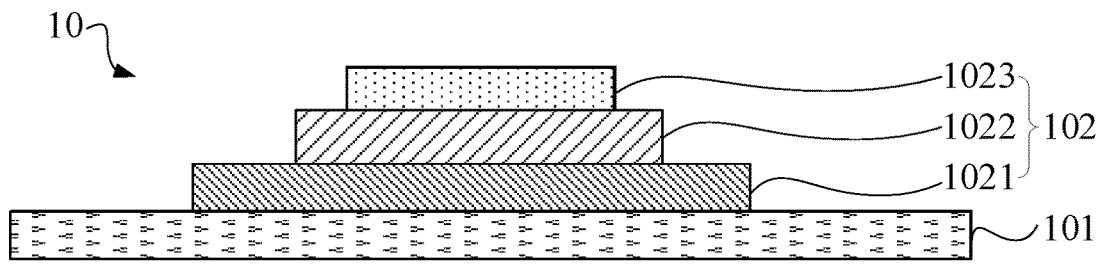
FIG. 1 is a schematic structural view of a first type of an array substrate provided by the present invention.

Please refer to FIG. 1, which is a schematic structural view of a first type of an array substrate 10 provided by the present invention. The array substrate 10 includes a substrate 101 and a photosensitive element 102. The photosensitive element 102 is disposed on the substrate 101 and includes a doped semiconductor layer 1021, an intrinsic semiconductor layer 1022, and a transparent electrode layer 1023 sequentially stacked. Specifically, the doped semiconductor layer 1021 is an N-type doped semiconductor, and the transparent electrode layer 1023 is a P-type transparent electrode. Alternatively, the doped semiconductor layer 1021 is a P-type doped semiconductor, and the transparent electrode layer 1023 is an N-type transparent electrode The array substrate 10 provided by the present invention improves a structure of the photosensitive element 102, and uses the transparent electrode layer 1023 as a pole of the photosensitive element 102. The transparent electrode layer 1023 does not absorb light in a visible light band, so that a greater amount of light can reach the intrinsic semiconductor layer 1022, thereby enhancing light absorption by an incident interface of the intrinsic semiconductor layer 1022. Therefore, an electric field generated in the photosensitive element 102 is stronger, which can effectively separate photo-generated electrons and holes, thereby enhancing sensitivity of the photosensitive element 102.

Specifically, the substrate is glass, functional glass (sensor glass), or a flexible substrate. The functional glass is obtained by sputtering a transparent metal oxide conductive thin film coating on ultra-thin glass and undergoing high-temperature annealing treatment. The transparent metal oxide material may be indium gallium zinc oxide (IGZO), indium zinc tin oxide (IZTO), indium gallium zinc tin oxide (IGZTO), indium tin oxide (ITO), indium zinc oxide (IZO), indium aluminum zinc oxide (IAZO), indium gallium tin oxide (IGTO), or antimony tin oxide (ATO). The flexible substrate is made of a polymer material. Specifically, the flexible substrate may be made of polyimide (PI), polyethylene (PE), polypropylene (PP), polystyrene (PS), polyethylene glycol terephthalate (PET), or polyethylene naphthalate two formic acid glycol ester (PEN). The polymer material has good flexibility, light weight, and impact resistance, and is suitable for flexible display panels. Among them, polyimide can further achieve good heat resistance and stability.

Specifically, the doped semiconductor layer 1021 has a thickness between 400 angstroms (Å) and 600 Å, the doped semiconductor layer 1021 has a Fermi level between 4.2 and 4.7, and the doped semiconductor layer 1021 has a refractive index between 3.8 and 4.2. Specifically, the doped semiconductor layer 1021 may have a thickness of 400 Å, 450 Å, 500 Å, 550, or 600 Å, and have a Fermi level of 4.2, 4.3, 4.4, 4.5, 4.6, of 4.7. The refractive index of the doped semiconductor layer 1021 is 3.8, 3.9, 4.0, 4.1, or 4.2.

Specifically, the intrinsic semiconductor layer 1022 has a thickness between 1000 Å and 7000 Å. The intrinsic semiconductor layer 1022 has a Fermi level between 4.6 and 5.0 and has a refractive index between 3.6 and 4.1. Specifically, the intrinsic semiconductor layer 1022 has a thickness of 1000 Å, 2000 Å, 3000 Å, 4000 Å, 5000 Å, 6000 Å, or 7000 Å, and may have a Fermi level of 4.6, 4.7, 4.8, 4.9, or 5.0. The refractive index of the intrinsic semiconductor layer 1022 may be 3.6, 3.7, 3.8, 3.9, 4.0, or 4.1. The thickness of the intrinsic semiconductor layer 1022 may be set according to needs of different display panels. The intrinsic semiconductor layer 1022 made of a material having a thickness within the above-mentioned thickness range can increase the sensitivity as well as being applicable to different types of display panels.

Specifically, the transparent electrode layer 1023 has a thickness between 500 Å and 800 Å. The transparent electrode layer 1023 has a Fermi level between 4.9 and 5.5 and has a refractive index between 1.6 and 2.0. Specifically, the thickness of the transparent electrode layer 1023 is 500 Å, 550 Å, 600 Å, 650 Å, 700 Å, 750 Å, or 800 Å, and a Fermi level of the transparent electrode layer 1023 may be 4.9, 5.0, 5.1, 5.2, 5.3, 5.4, or 5.5, and the refractive index of the transparent electrode layer 1023 may be 1.6, 1.7, 1.8, 1.9, or 2.0. Since the thickness of the transparent electrode layer 1023 is relatively small, the transparent electrode layer 1023 made of a material having a thickness within the above-mentioned thickness range can further reduce the light absorption by the transparent electrode layer 1023 and allow a greater amount of light to pass through the transparent electrode layer 1023 to reach the intrinsic semiconductor layer 1022, thereby achieving the effect of increasing sensitivity.

The Fermi level of the doped semiconductor layer 1021 is less than the Fermi level of the intrinsic semiconductor layer 1022, and the Fermi level of the intrinsic semiconductor layer 1022 is less than the Fermi level of the transparent electrode layer 1023. In this manner, it can ensure the transition of carriers in the photosensitive element 102, facilitate the flow of electrons after the photosensitive element 102 absorbs light, and improve the sensitivity of the photosensitive element 102.

A refractive index range of the doped semiconductor layer 1021, the intrinsic semiconductor layer 1022, and the transparent electrode layer 1023 is set to improve a light utilization rate of the photosensitive element 102. Within the aforementioned refractive index range, the photosensitive sensitivity of the photosensitive element 102 can be effectively improved.

The transparent electrode layer 1023 is made of metal oxide. Specifically, a material of the metal oxide may be zinc oxide (ZnO), indium oxide ($In_2O_3$), indium gallium zinc oxide (IGZO), indium zinc tin oxide (IZTO), indium gallium zinc tin oxide (IGZTO), indium tin oxide Indium zinc oxide (ITO), indium zinc oxide (IZO), indium aluminum zinc oxide (IAZO), indium gallium tin oxide (IGTO), or antimony tin oxide (ATO). The above-mentioned materials have good conductivity and transparency, and have a small thickness, which will not affect an overall thickness of the display panel. Furthermore, they can also reduce electronic radiation, ultraviolet light, and infrared light harmful to humans. Among the above materials, materials with high work function can be selected to prepare the transparent electrode layer 1023 according to actual needs.

It should be noted that the P-type and N-type of the transparent electrode layer 1023 and the doped semiconductor layer 1022 are relative concepts. That is, when the doped semiconductor layer 1021 is an N-type doped semiconductor, the transparent electrode layer 1023 is a P-type transparent electrode. When the doped semiconductor layer 1021 is a P-type doped semiconductor, the transparent electrode layer 1023 is an N-type transparent electrode. The P-type transparent electrode and the N-type transparent electrode do not need to be realized by doping in the form of particle injection or the like, but are realized by adjusting the process parameters of the transparent electrode layer 1023. Specific parameters of preparation processes of the P-type transparent electrode and the N-type transparent electrode are common technical means in material-related fields, and will not be repeated here.

Figure 2:
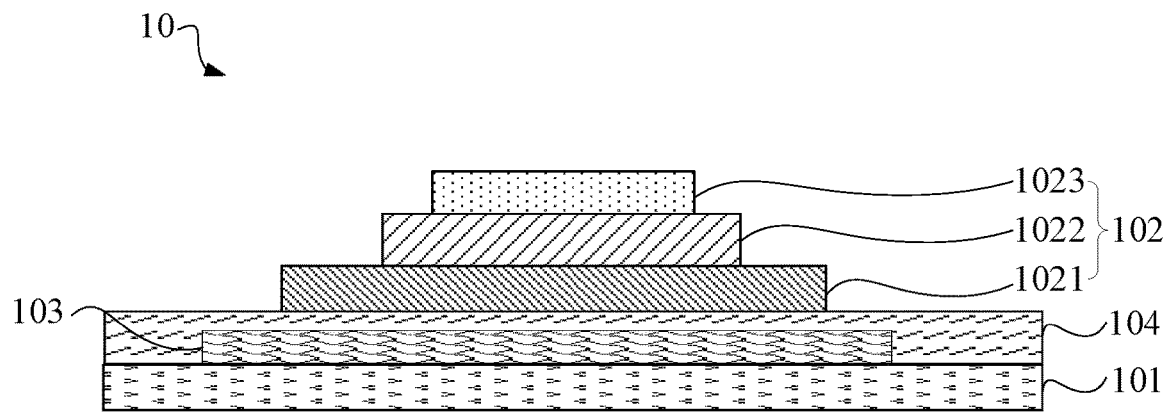
FIG. 2 is a schematic structural view of a second type of an array substrate provided by the present invention.

Please refer to FIG. 2, which is a schematic structural view of a second type of an array substrate 10 provided by the present invention. A light shielding layer 103 and a buffer layer 104 are disposed between the substrate 101 and the doped semiconductor layer 1021. The light shielding layer 103 is disposed on a side surface of the substrate 101 and partially covers the substrate 101. The buffer layer 104 is disposed on a side of the light shielding layer 103 away from the substrate 101 and extends to the substrate 101. The photosensitive element 102 is disposed on a side of the buffer layer 104 away from the substrate 101 and is located in an area within an orthographic projection of the light shielding layer 103 on the substrate 101.

The light shielding layer 103 arranged between the substrate 101 and the doped semiconductor layer 1021 can reflect or absorb ambient light and other light sources on the side of the substrate 101, eliminate signal interference from ambient light and other light sources, remarkably reduce interference of ambient light and other light sources on the photosensitive device 102, and significantly improve a signal-to-noise ratio of the display panel.

Specifically, the buffer layer 104 includes a silicon nitrogen layer and a silicon oxygen layer sequentially stacked, or a combination thereof. A stacked structure of the buffer layer 104 is not the protection focus of the present invention, so it is not shown in the drawings of the present invention. A material used for the silicon nitride layer is silicon nitride (SiNx), and a thickness of the silicon nitride layer is 40 nanometers (nm) to 60 mn. A material used for the silicon oxide layer is silicon dioxide (SiO2), and a thickness of the silicon oxide layer is 200 nm to 400 nm. Specifically, a thickness of the silicon nitride layer is 40 nm, 45 nm, 50 nm, 55 nm, or 60 nm. A thickness of the silicon oxide layer is 200 nm, 250 nm, 300 nm, 350 nm, or 400 nm.

Figure 3:
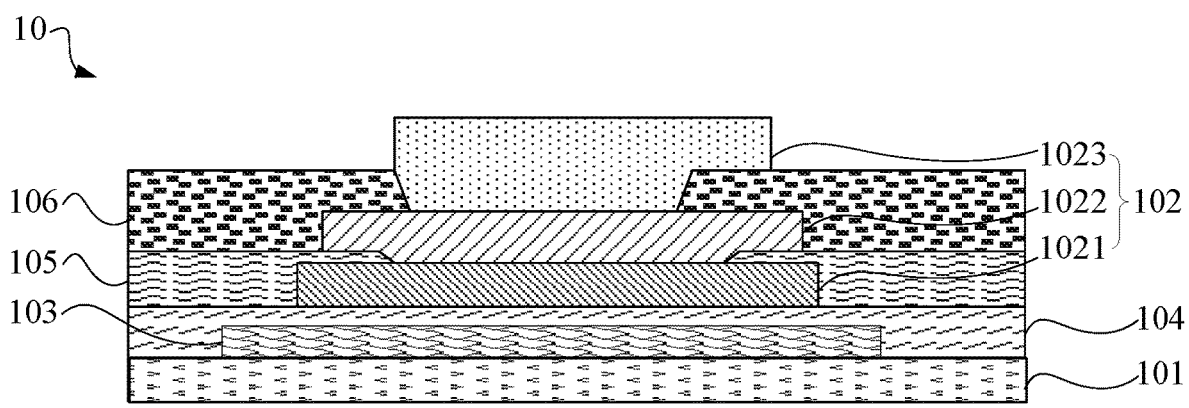
FIG. 3 is a schematic structural view of a third type of an array substrate provided by the present invention.

Please refer to FIG. 3, which is a schematic structural view of a third type of an array substrate 10 provided by the present invention. The array substrate 10 shown in FIG. 3 is different from the array substrate 10 shown in FIG. 2 in that a first insulting layer 105 and a second insulting layer 106 are further included in the array substrate 10 shown in FIG. 3. The first insulating layer 105 is disposed on a side of the doped semiconductor layer 1021 away from the substrate 101 and extends to the buffer layer 104, and a first via hole is defined in the first insulating layer 105. The intrinsic semiconductor layer 1022 is disposed on a side of the first insulating layer 105 away from the substrate 101 and is connected to the doped semiconductor 1021 through the first via hole. The second insulating layer 106 is disposed on a side of the intrinsic semiconductor layer 1022 away from the substrate 101 and extends to the first insulating layer 105, and a second via hole is defined in the second insulating layer 106. The transparent electrode layer 1023 is disposed on a side of the second insulating layer 106 away from the doped semiconductor layer 1021 and is connected to the intrinsic semiconductor layer 1022 through the second via hole.

An orthographic projection projected by the second via hole on the substrate 101 falls within an orthographic projection projected by the first via hole on the substrate 101. In this manner, an area overlapped by the doped semiconductor layer 1021, the intrinsic semiconductor layer 1022, and the transparent electrode layer 1023 of the photosensitive layer 102 can be larger, which is beneficial to increase a light utilization rate of the photosensitive element 102, as well as enhancing the mobility of electron transitions.

Specifically, a material used for the doped semiconductor layer 1021 is polysilicon (poly-Si), and a material used for the intrinsic semiconductor layer is amorphous silicon (α-Si). Poly-Si has high process compatibility and is inactive at room temperature, so the stability of the device is high. In addition, poly-Si has excellent semiconductor characteristics and has been widely used in electronic industries. The α-Si process is simple and mature, low-cost, and suitable for large-sized liquid crystal display (LCD) panels and inexpensive electrophoretic display (EPD) panels.

The doping of the doped semiconductor layer 1021 can be high-concentration doping (P+/N+) or low-concentration doping (P−/N−), which can be adjusted according to specific device requirements of the photosensitive element 102.

It should be noted that the array substrate 10 provided by the present invention further includes other structures, such as thin-film transistors and other wirings. When the doped semiconductor layer 1021 and the intrinsic semiconductor layer 1022 of the photosensitive element 102 are poly-Si and α-Si, respectively, a two-layered structure cannot be prepared by a same process (mask). In order to be adapted to manufacturing processes of the overall array substrate 10, it is necessary to provide an insulating layer between the doped semiconductor layer 1021 and the intrinsic semiconductor layer 1022. Likewise, an insulating layer is also needed between the intrinsic semiconductor layer 1022 and the transparent electrode layer 1023. Moreover, a provision of the first insulating layer 105 and the second insulating layer 106 can facilitate patterning of subsequent film layers and prevent the structure of the photosensitive element 102 from being shorted to other structures to cause leakage, thereby adversely affecting performance of the display panel.

The first insulating layer 105 and the second insulating layer 106 are made of silicon nitrogen compounds, silicon oxygen compounds, or a combination of the above compounds.

Figure 4:
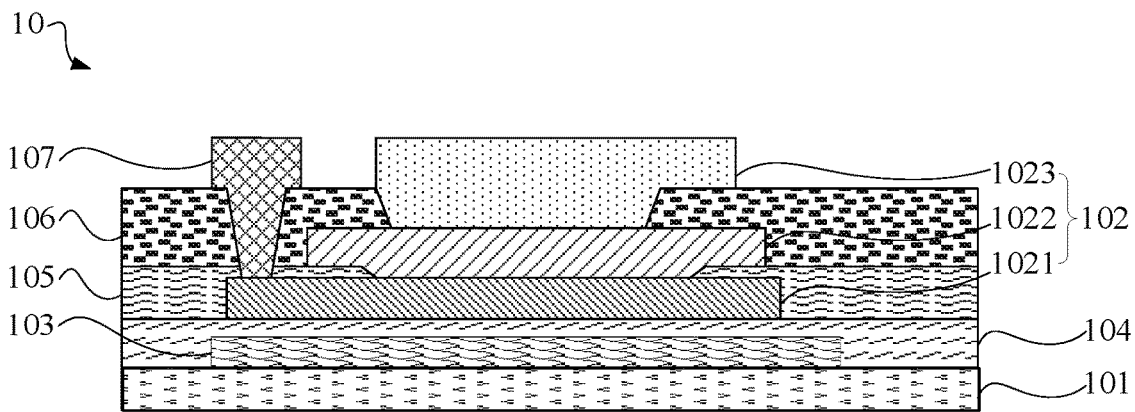
FIG. 4 is a schematic structural view of a fourth type of an array substrate provided by the present invention.

Please refer to FIG. 4, which is a schematic structural view of a fourth type of an array substrate 10 provided by the present invention. The array substrate 10 shown in FIG. 4 is different from the array substrate 10 shown in FIG. 3 in that a metal layer 107 is further provided. The metal layer 107 is configured in a same layer as the transparent electrode layer 1023. A third via hole is further defined in the first insulating layer 105 and the second insulating layer 106, and the metal layer 107 is connected to the doped semiconductor layer 1021 through the third via hole.

It should be noted that the metal layer 107 functions as a metal lead, and the metal layer 107 is connected to a circuit for inputting a signal to the photosensitive element 102. The metal layer 107 connected to the doped semiconductor layer 1021 through the third via hole can prevent the photosensitive element 102 from contacting an edge of the metal layer 10 to cause a short circuit, thereby adversely affecting performance of the display panel.

Figure 5:
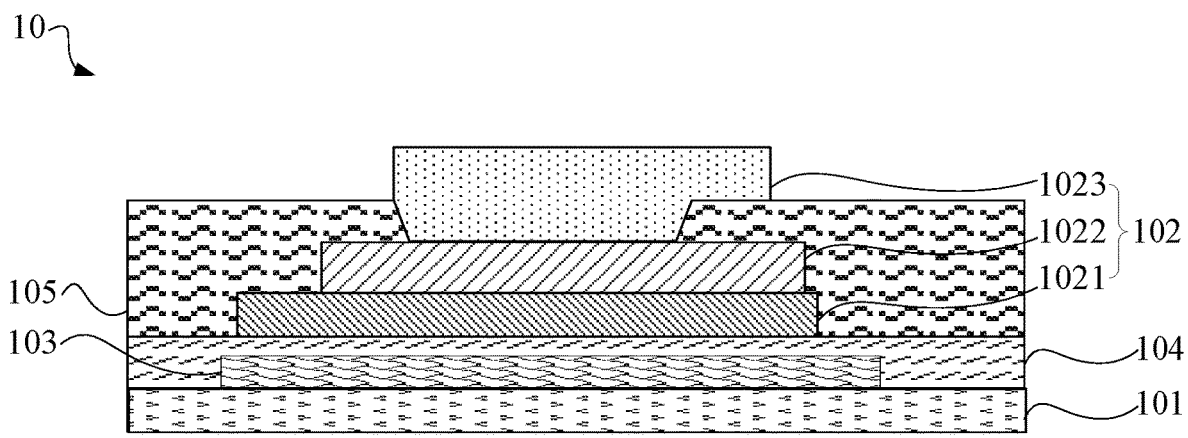
FIG. 5 is a schematic structural view of a fifth type of an array substrate provided by the present invention.

Please refer to FIG. 5, which is a schematic structural view of a fifth type of an array substrate 10 provided by the present invention. The array substrate 10 shown in FIG. 5 is different from the array substrate 10 shown in FIG. 2 in that the array substrate 10 of FIG. 5 further includes a first insulating layer 105, the doped semiconductor layer 1021 is disposed on the substrate 101, and the intrinsic semiconductor layer 1022 is disposed on a side of the first insulating layer 105 away from the substrate 101. The first insulating layer 105 is disposed on a side of the intrinsic semiconductor layer 1022 away from the substrate 101 and extends to the buffer layer 104, and a first via hole is defined in the first insulating layer 105. The transparent electrode layer 1023 is disposed on a side of the first insulating layer 105 away from the intrinsic semiconductor layer 1022 and is connected to the intrinsic semiconductor layer 1022 through the first via hole.

Specifically, each of the doped semiconductor layer 1021 and the intrinsic semiconductor layer 1022 is made of amorphous silicon (α-Si).

The doping of the doped semiconductor layer 1021 can be high-concentration doping (P+/N+) or low-concentration doping (P−/N−), which can be adjusted according to specific device requirements of the photosensitive element 102.

It should be noted that when the doped semiconductor layer 1021 and the intrinsic semiconductor layer 1022 of the photosensitive element 102 are α-Si, a two-layered structure made of is prepared by a same process (mask), so that there is no need to provide an additional insulating layer between the doped semiconductor layer 1021 and the intrinsic semiconductor layer 1022. In contrast, the intrinsic semiconductor layer 1022 and the transparent electrode layer 1023 are not made by a same process (mask). In order to be adapted to manufacturing processes of the overall array substrate 10, it is necessary to provide an insulating layer between the intrinsic semiconductor layer 1022 and the transparent electrode layer 1023. Moreover, a provision of the first insulating layer 105 can facilitate patterning of subsequent film layers, and prevent the structure of the photosensitive element 102 from being shorted to other structures to cause leakage, thereby adversely affecting performance of the display panel.

Figure 6:
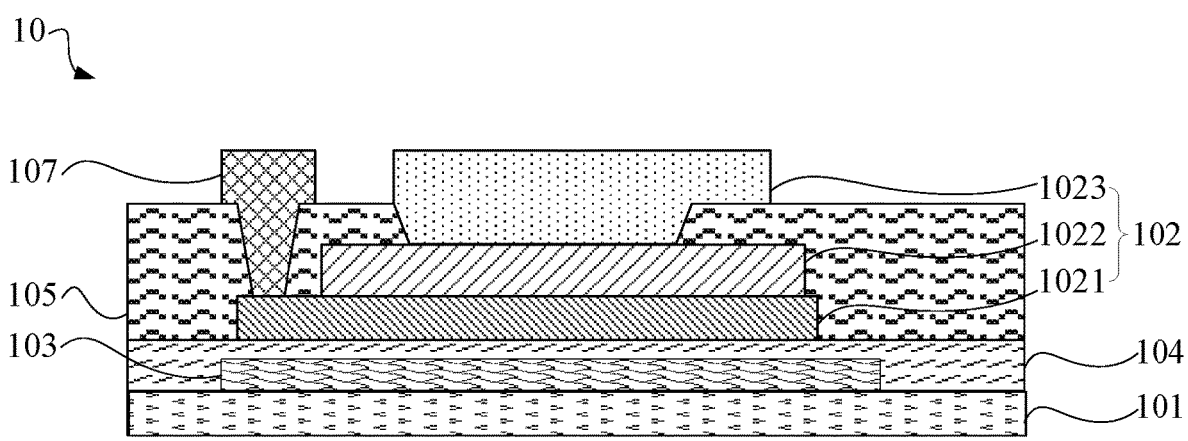
FIG. 6 is a schematic structural view of a sixth type of an array substrate provided by the present invention.

Please refer to FIG. 6, which is a schematic structural view of a sixth type of an array substrate 10 provided by the present invention. The array substrate 10 shown in FIG. 6 is different from the array substrate 10 shown in FIG. 5 in that a metal layer 107 is further provided. A second via hole is further defined in the first insulating layer 105. The metal layer 107 is configured in a same layer as the transparent electrode layer 1023 and is connected to the doped semiconductor layer 1021 through the second via hole.

It should be noted that the metal layer 107 functions as a metal lead, and the metal layer 107 is connected to a circuit for inputting a signal to the photosensitive element 102. The metal layer 107 connected to the doped semiconductor layer 1021 through the second via hole can prevent the photosensitive element 102 from contacting an edge of the metal layer 10 to cause a short circuit, thereby adversely affecting performance of the display panel.

In the array substrate 10 provided by the present invention, the photosensitive element 102 employed is a stacked structure including a doped semiconductor layer 1021, an intrinsic semiconductor layer 1022, and a transparent semiconductor layer 1023. Since the transparent electrode layer 1023 does not absorb light in a visible light band, a greater amount of light can reach the intrinsic semiconductor layer 1022, thereby enhancing the light absorption by an incident interface of the intrinsic semiconductor layer 1022. Therefore, an electric field generated in the photosensitive element 102 is stronger, which can effectively separate photo-generated electrons and holes, thereby enhancing sensitivity of the photosensitive element 102.

Figure 7:
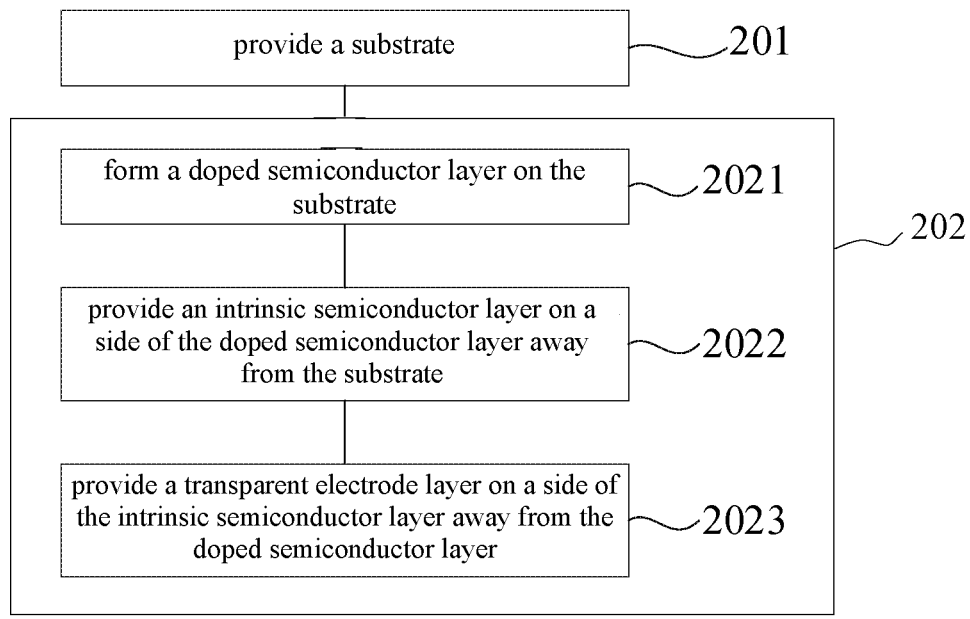
FIG. 7 is a flowchart showing a first type of a method of manufacturing an array substrate provided by the present invention.

The present invention provides a method of manufacturing an array substrate. Please refer to FIG. 7, which is a flowchart showing a first type of a method of manufacturing an array substrate provided by the present invention. The method includes following steps:

201: provide a substrate.

202: provide a photosensitive element on the substrate, wherein the provide the photosensitive element includes:

2021: form a doped semiconductor layer on the substrate.

Specifically, a semiconductor layer is formed on the substrate, and then perform an ion implantation process on the semiconductor layer to obtain the doped semiconductor layer. Specifically, a layer of poly-Si is formed on the substrate, and then an ion implanter is used to implant ions in openings of the poly-Si. Then, a thermal annealing activation step is performed to arrange chaotic ions in positions of Si atoms in an orderly manner, so that the doped poly-Si layer is prone to ohmic contact to obtain the doped semiconductor layer. When N-type doping is performed on poly-Si, the ions used are phosphorus (P) ions.

2022: provide an intrinsic semiconductor layer on a side of the doped semiconductor layer away from the substrate.

Specifically, use a deposition technique to form the intrinsic semiconductor layer. Under an action of plasma or electric field, an intrinsic semiconductor layer material is bombarded, and molecules, atoms, ions and electrons of the intrinsic semiconductor layer material are sputtered out. The sputtered intrinsic semiconductor layer material has a certain kinetic energy and is projected toward the doped semiconductor layer in a certain direction, thereby forming an intrinsic semiconductor layer on the doped semiconductor layer. The deposition technique employed is fast, film being formed is dense, and adhesion is good, which is quite suitable for large-scale and high-efficiency industrial production.

2023: provide a transparent electrode layer on a side of the intrinsic semiconductor layer away from the doped semiconductor layer.

Specifically, the doped semiconductor layer is an N-type doped semiconductor, and the transparent electrode layer is a P-type transparent electrode, or the doped semiconductor layer is a P-type doped semiconductor, and the transparent electrode layer is an N-type transparent electrode.

Specifically, use a deposition technique to form the transparent electrode layer. Specifically, a physical vapor deposition (PVD) method can be used to form the transparent electrode layer, and details will not be repeated here. The physical vapor deposition is a simple process and can improve the environment, has no pollution and less consumables, and achieve a film formation being uniform and dense along with a strong bonding with the substrate.

Figure 8:
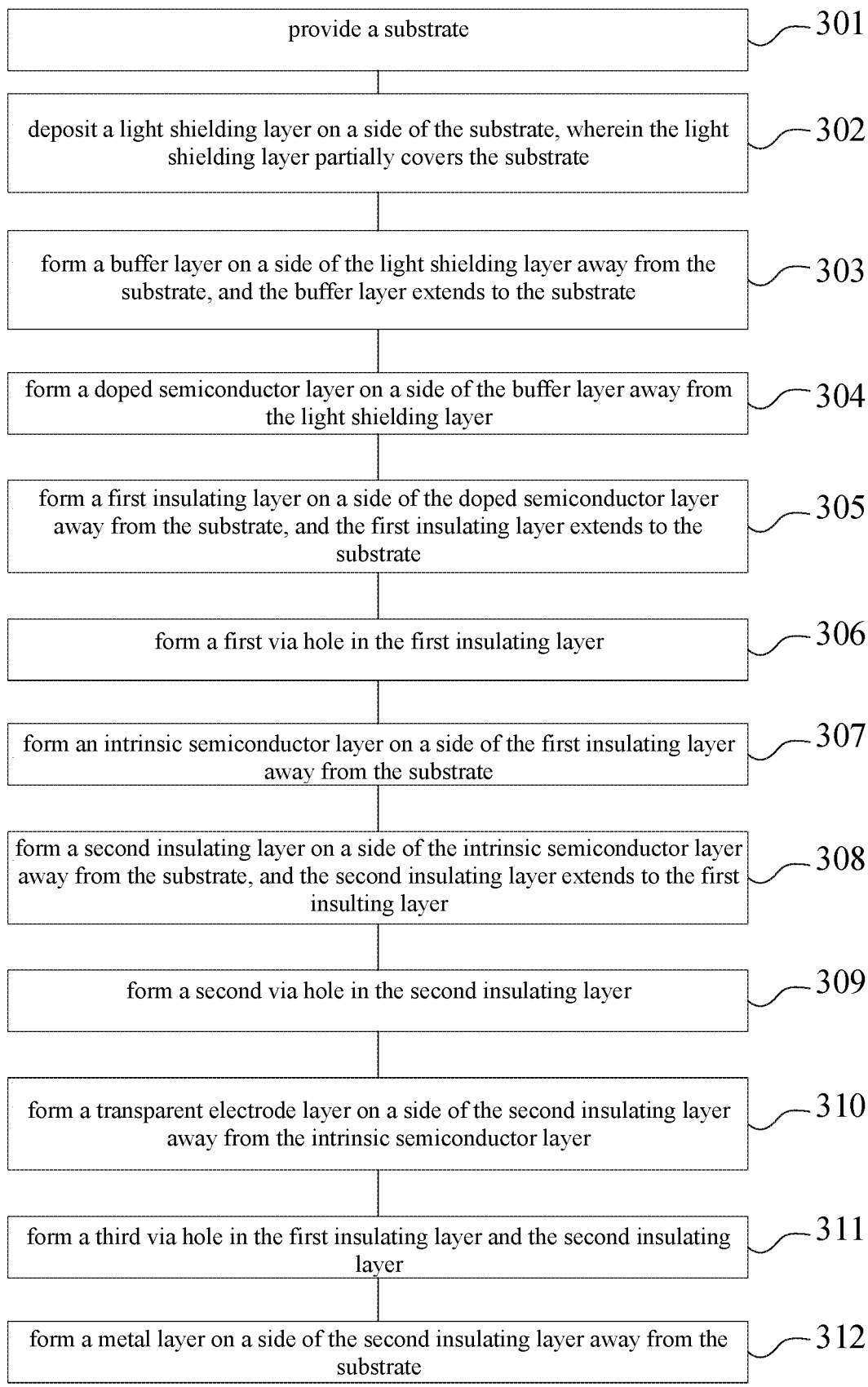
FIG. 8 is a flowchart showing a second type of a method of manufacturing an array substrate provided by the present invention.

Please refer to FIG. 8, which is a flowchart showing a second type of a method of manufacturing an array substrate provided by the present invention, and the method includes following steps:

301: provide a substrate.

302: deposit a light shielding layer on a side of the substrate, wherein the light shielding layer partially covers the substrate.

Specifically, first, a light shielding film layer is prepared on the substrate, and then the light shielding film layer is patterned by an exposure and etching process to obtain the light shielding layer.

303: form a buffer layer on a side of the light shielding layer away from the substrate, and the buffer layer extends to the substrate.

In one embodiment, a silicon nitride layer is provided on the side of the light shielding layer away from the substrate, the silicon nitride layer covers the light shielding layer and extends to the substrate, and then a silicon oxide layer is provided on a side of the silicon nitride layer away from the light shielding layer to obtain the buffer layer.

304: form a doped semiconductor layer on a side of the buffer layer away from the light shielding layer.

Specifically, a semiconductor film layer is arranged on the side of the buffer layer away from the light shielding layer, and then the semiconductor film layer is patterned by an exposure and etching process to obtain a semiconductor layer. Nest, use an ion implanter to implant ions in openings of the semiconductor layer. Then, a thermal annealing activation step is performed to arrange chaotic ions in positions of Si atoms in an orderly manner, so that the doped semiconductor layer is prone to ohmic contact.

305: form a first insulating layer on a side of the doped semiconductor layer away from the substrate, and the first insulating layer extends to the substrate.

Specifically, use a deposition technique to form the first insulating layer, and details will not be repeated here.

306: form a first via hole in the first insulating layer.

307: form an intrinsic semiconductor layer on a side of the first insulating layer away from the substrate.

Specifically, the intrinsic semiconductor layer is deposited on the side of the first insulating layer away from the substrate, then the intrinsic semiconductor layer is patterned by an exposure and etching process to obtain the intrinsic semiconductor layer. Details of the deposition technique is not repeated here.

Specifically, the intrinsic semiconductor layer is connected to the doped semiconductor layer through the first via hole.

308: form a second insulating layer on a side of the intrinsic semiconductor layer away from the substrate, and the second insulating layer extends to the first insulting layer.

Specifically, use a deposition technique to form the second insulating layer. Details of the deposition technique is not repeated here.

309: form a second via hole in the second insulating layer.

Specifically, the form the second via hole in the second insulating layer includes following steps:

3091: use a rapid thermal annealing process to activate the second insulating layer.

The rapid thermal annealing (RTA) process is used to activate doping elements in semiconductor materials and restore amorphous structure caused by ion implantation to a complete lattice structure. Using this annealing method can activate the doped semiconductor layer and enhance doping efficiency. Specifically, the array substrate is rapidly heated from ambient temperature to about 1000 K to 1500 K, and quenched after holding for a few seconds.

3092: Etch the second insulating layer to obtain a second via hole in the second insulating layer.

310: form a transparent electrode layer on a side of the second insulating layer away from the intrinsic semiconductor layer.

Specifically, use a deposition technique to form a transparent electrode film layer on the side of the second insulating layer away from the intrinsic semiconductor layer. Then, use an exposure and etching process to pattern the transparent electrode film layer to obtain the transparent electrode layer. Details of the deposition technique is not repeated here.

Specifically, the transparent electrode layer is connected to the intrinsic semiconductor layer through the second via hole.

The photosensitive element so formed is located within an orthographic projection of the light shielding layer projected on the substrate.

311: form a third via hole in the first insulating layer and the second insulating layer.

312: form a metal layer on a side of the second insulating layer away from the substrate.

Specifically, the metal layer is connected to the doped semiconductor layer though the third via hole.

Specifically, the doped semiconductor layer is an N-type doped semiconductor, and the transparent electrode layer is a P-type transparent electrode, or the doped semiconductor layer is a P-type doped semiconductor, and the transparent electrode layer is an N-type transparent electrode. The doped semiconductor layer is made of polysilicon (poly-Si), and the intrinsic semiconductor layer is made of amorphous silicon ($\alpha$-Si).

Figure 9:
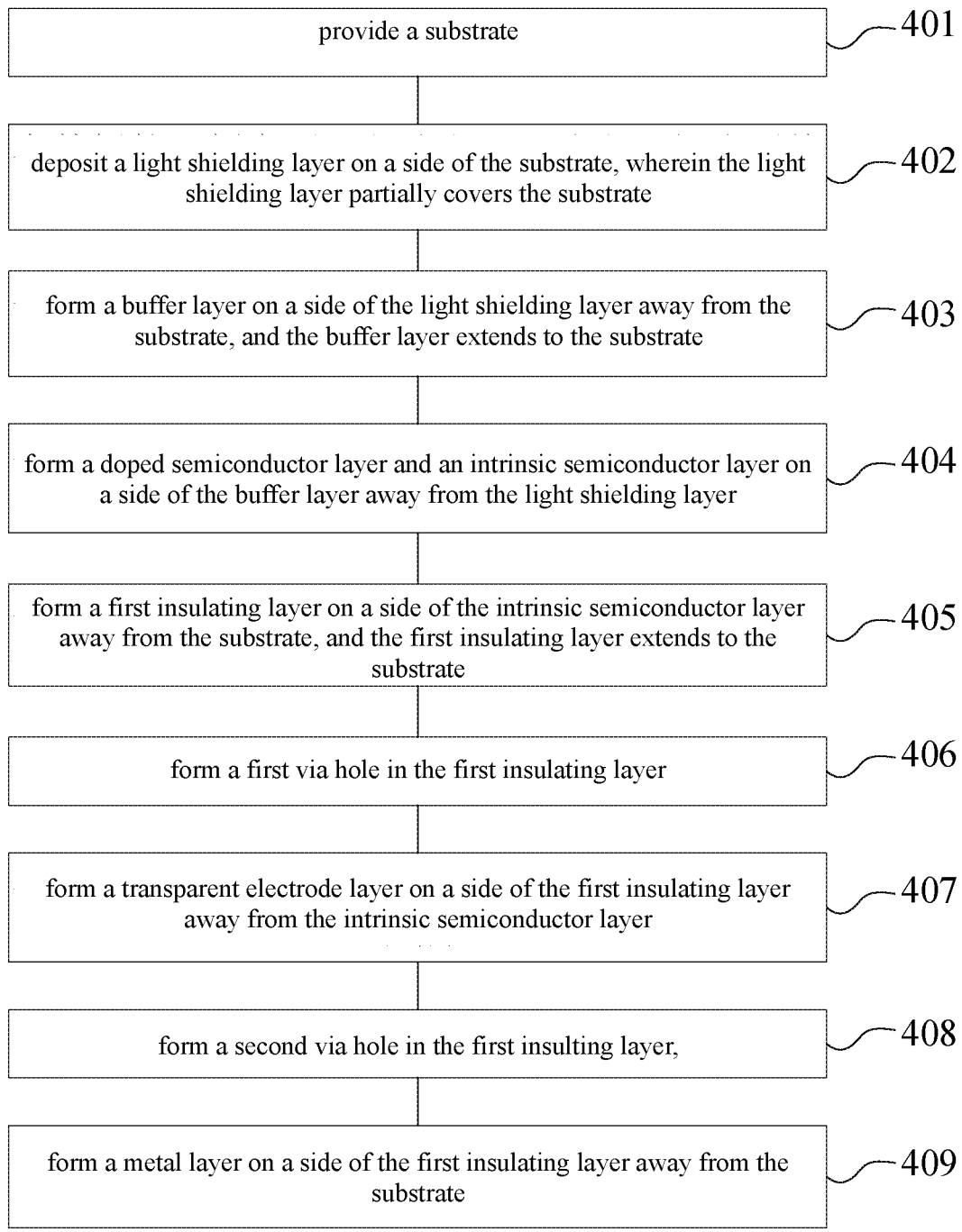
FIG. 9 is a flowchart showing a third type of a method of manufacturing an array substrate provided by the present invention.

Please refer to FIG. 9, which is a flowchart showing a third type of a method of manufacturing an array substrate provided by the present invention. The method includes following steps:

401: provide a substrate.

402: deposit a light shielding layer on a side of the substrate, wherein the light shielding layer partially covers the substrate.

403: form a buffer layer on a side of the light shielding layer away from the substrate, and the buffer layer extends to the substrate.

404: form a doped semiconductor layer and an intrinsic semiconductor layer on a side of the buffer layer away from the light shielding layer.

405: form a first insulating layer on a side of the intrinsic semiconductor layer away from the substrate, and the first insulating layer extends to the substrate.

406: form a first via hole in the first insulating layer.

407: form a transparent electrode layer on a side of the first insulating layer away from the intrinsic semiconductor layer.

Specifically, the transparent electrode layer is connected to the intrinsic semiconductor layer through the first via hole.

408: form a second via hole in the first insulting layer, wherein the form the second via hole in the first insulting layer includes following steps:

4081: use a rapid thermal annealing process to activate the first insulating layer.

The rapid thermal annealing (RTA) process is used to activate doping elements in semiconductor materials and restore amorphous structure caused by ion implantation to a complete lattice structure. Using this annealing method can activate the doped semiconductor layer and enhance doping efficiency. Specifically, the array substrate is rapidly heated from ambient temperature to about 1000 K to 1500 K, and quenched after holding for a few seconds.

4082: etch the first insulating layer to obtain the second via hole in the first insulating layer.

409: form a metal layer on a side of the first insulating layer away from the substrate.

Specifically, the metal layer is connected to the doped semiconductor layer though the second via hole.

Specifically, the doped semiconductor layer is an N-type doped semiconductor, and the transparent electrode layer is a P-type transparent electrode, or the doped semiconductor layer is a P-type doped semiconductor, and the transparent electrode layer is an N-type transparent electrode. The doped semiconductor layer and the intrinsic semiconductor layer are made of amorphous silicon ($\alpha$-Si).

In the embodiment shown in FIG. 9, the method of providing the film layers is the same as that of the previous embodiment, and will not be repeated here. Since the materials used for the doped semiconductor layer and the intrinsic semiconductor layer in the embodiment shown in FIG. 9 are both amorphous silicon (α-Si), the doped semiconductor layer and the intrinsic semiconductor layer can be fabricated by the same process. One-time process of manufacturing the film layers and one process of manufacturing an insulating layer are reduced. In this manner, it reduces both the manufacturing process steps and manufacturing difficulty, and speeds up production efficiency.

The method of manufacturing the array substrate provided by the present invention is compatible with manufacturing processes of other devices or structures of the array substrate, and does not increase any redundant manufacturing process. In addition, the array substrate manufactured by the method of manufacturing the array substrate uses a photosensitive element having a stacked structure including a doped semiconductor layer, an intrinsic semiconductor layer and a transparent semiconductor layer. Since the transparent electrode layer does not absorb light in a visible light band, a greater amount of light can reach the intrinsic semiconductor layer, thereby enhancing the light absorption by an incident interface of the intrinsic semiconductor layer. Therefore, an electric field generated in the photosensitive element is stronger, which can effectively separate photo-generated electrons and holes, thereby enhancing sensitivity of the photosensitive element.

The present invention provides a display panel. The display panel may be an active light-emitting display panel, such as an organic light-emitting diode (OLED) display panel, an active matrix organic light-emitting diode (AMO-LED) display panel, and a passive matrix organic light-emitting diode (PMOLED) display panel, quantum dot light emitting diode (QLED) display panel, micro light-emitting diode (Micro-LED) display panel, and sub-millimeter Mini light-emitting diode (Mini-LED) display panel, etc., or may be a passive light-emitting display panel such as a liquid crystal display (LCD) panel.

The present invention does not limit a type of LCD panel, which may be a vertical electric field type LCD panel, such as a twisted nematic (TN) type LCD panel, and a multi-domain vertical alignment (Multi-domain Vertical Alignment, MVA) type LCD panel, or may be a horizontal electric field type LCD panel, such as a fringe field switching (Fringe Field Switching, FFS) type LCD panel or an in-plane switching (In-Plane Switching, IPS) type LCD panel.

Figure 10:
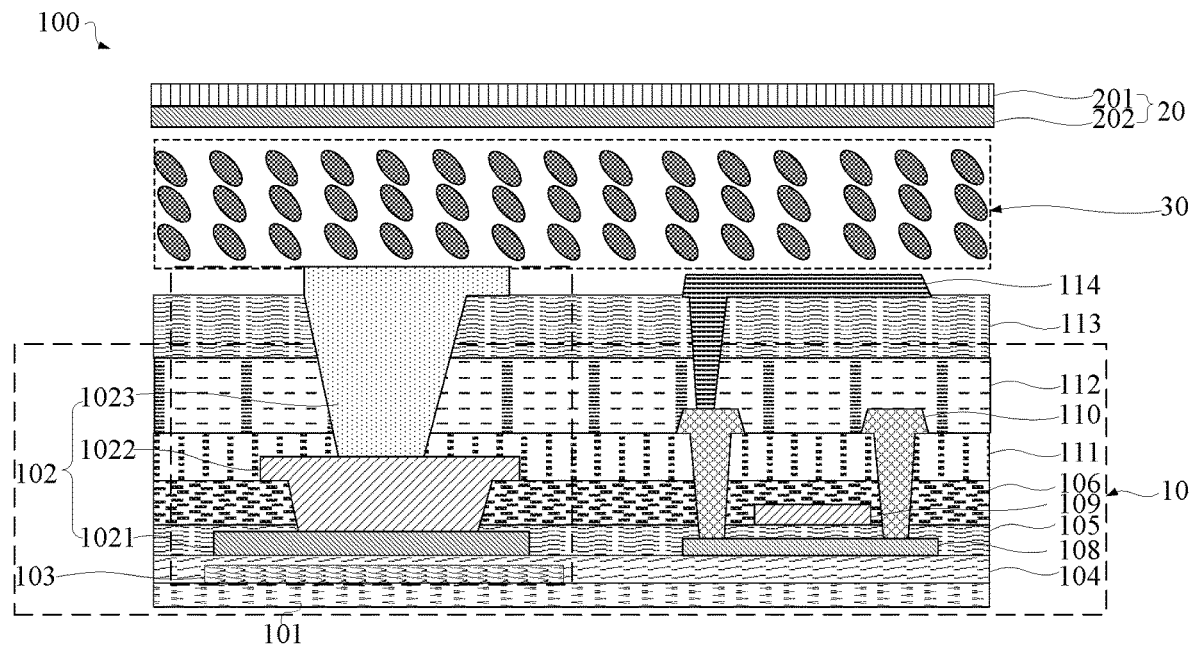
FIG. 10 is a schematic structural view of a first type of a display panel provided by the present invention.

Please refer to FIG. 10, which is a schematic structural view of a first type of a display panel 100 provided by the present invention. In FIG. 10, a liquid crystal display panel is taken as an example for illustration. The display panel 100 includes an array substrate 10 and an opposite substrate 20 disposed opposite to each other, and a liquid crystal layer 30 disposed between the array substrate 10 and the opposite substrate 20, wherein the array substrate 10 is one of the array substrates described in the aforementioned embodiments. In this embodiment, the array substrate 10 is a substrate for the provision of thin-film transistors, and the opposite substrate 20 is a color filter substrate.

Specifically, the array substrate 10 includes a substrate 101, a light shieling layer 103, a buffer layer 104, a doped semiconductor layer 1021, an active layer 108 configured in a same layer as the doped semiconductor layer 1021, a first insulating layer 105, a gate electrode layer 109, a second insulating layer 106, an intrinsic semiconductor layer 1022, a third insulating layer 111, a source/drain wiring 110, a planarization layer 112, a passivation layer 113, a transparent electrode layer 1023, and a first electrode layer 114 configured in a same layer as the transparent electrode layer 1023 all sequentially disposed in a stacked arrangement.

Specifically, when integrated into an LCD panel, the intrinsic semiconductor layer 1022 may be provided on the first insulating layer 105 in a same layer as the gate electrode layer 109, or may be provided as shown in FIG. 10. The transparent electrode layer 1023 may be configured in a same layer as the source/drain wiring 110, or may be configured in a same layer as the first electrode layer 114 as shown in FIG. 10. The photosensitive element 102 in this application can be set according to actual manufacturing process requirements of the display panel 100, which is not limited in this application.

This application also does not limit types of the array substrate and the opposite substrate. In other embodiments of the present application, the array substrate and the opposite substrate may be color filter on array (COA) type array substrate and opposite substrate, respectively. The array substrate and the opposite substrate may also include other devices. The specific arrangement of the array substrate and the opposite substrate are related technologies well known to those skilled in the art, and will not be repeated here.

Figure 11:
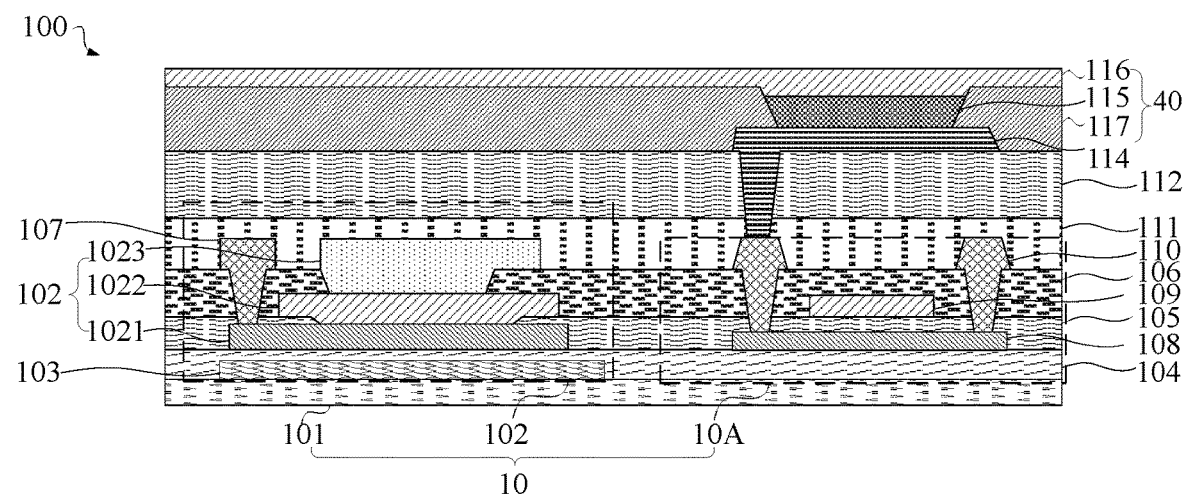
FIG. 11 is a schematic structural view of a second type of a display panel provided by the present invention.

Please refer to FIG. 11, which is a schematic structural view of a second type of a display panel 100 provided by the present invention. The display panel 100 in FIG. 11 is an OLED display panel as an example for illustration. The display panel 100 includes the array substrate 10 as mentioned above and a light-emitting module 20. The array substrate 10 includes the aforementioned substrate 101, the aforementioned photosensitive element 102, and a thin-film transistor device 10A. The display panel 100 may further include other devices. The light-emitting module 20 and other devices and their assembly in the present invention are related technologies well known to those skilled in the art, and will not be repeated here.

Specifically, the display panel 100 includes the substrate 101, the light shieling layer 103, the buffer layer 104, the doped semiconductor layer 1021, the active layer 108 configured in a same layer as the doped semiconductor layer 1021, the first insulating layer 105, the intrinsic semiconductor layer 1022, the gate electrode layer 109 configured in a same layer as the intrinsic semiconductor layer 1022, the second insulating layer 106, the transparent electrode layer 1023, the metal layer 107 configured in a same layer as the transparent electrode layer 1023, a source/drain wiring 110 configured in a same layer as the transparent electrode layer 1023, a passivation layer 111, a planarization layer 112, a first electrode layer 114, a pixel definition layer 114, a light-emitting layer 115, and a second electrode layer 116 all sequentially disposed in a stacked arrangement.

Specifically, the first insulating layer 105 covers the doped semiconductor layer 1021 and the active layer 108, and the first insulating layer 105 is multiplexed as an interlayer dielectric layer of the thin-film transistor device 10A. The second insulating layer 106 covers the intrinsic semiconductor layer 1022 and the gate electrode layer 109, and the second insulating layer is multiplexed as a gate insulating layer of the thin-film transistor device 10A. The passivation layer 111 covers the transparent electrode layer 1023, the metal layer 107, and the source/drain wiring 110. The source/drain wiring 110 is connected to the active layer 108 through via holes in the second insulating layer 106. The via holes in the second insulating layer 106 can be formed by a mask through an etching process. The first electrode layer 114 is connected to the source/drain wiring 110. The light-emitting layer 115 is provided corresponding to the first electrode layer 114 and connected to the first electrode layer 114.

Specifically, the first electrode layer 114 may be an anode, and the second electrode layer 116 may be a cathode.

The specific structure of the OLED display panel provided by the present invention is to better illustrate the arrangement and positional relationship of the photosensitive elements in the present invention, and is not intended to limit the present invention. Certain film layers in the OLED display panel can be changed in settings according to requirements.

In the array substrate 10 provided by the present invention, a photosensitive element employed is a stacked structure including a doped semiconductor layer, an intrinsic semiconductor layer, and a transparent semiconductor layer. Since the transparent electrode layer does not absorb light in a visible light band, a greater amount of light can reach the intrinsic semiconductor layer, thereby enhancing the light absorption by an incident interface of the intrinsic semiconductor layer. Therefore, an electric field generated in the photosensitive element is stronger, which can effectively separate photo-generated electrons and holes, thereby enhancing sensitivity of the photosensitive element.

The display panel 100 provided by the present invention can be applied to at least one of electronic devices, which can be smart phones, tablet personal computers, mobile phones, video phones, e-book readers, desktop PCs, laptop PCs, netbook computers, workstations, servers, personal digital assistants, portable multimedia players, MP3 players, mobile medical devices, cameras, game consoles, digital cameras, vehicle navigation systems, electronic billboards, ATMs (automated teller machines), or wearable devices The above describes the array substrate, the method of manufacturing the array substrate, and the display panel provided by the embodiments of the present disclosure in detail. In this article, specific examples are used to illustrate the principle and implementation of the present invention. The descriptions of the above embodiments are only used to help understand the technical solutions and kernel ideas of the present disclosure; those of ordinary skill in the art should understand that they can still modify the technical solutions described in the foregoing embodiments, whereas these modifications or substitutions do not deviate the essence of the corresponding technical solutions from the scope of the technical solutions of the embodiments of the present disclosure.

What is claimed is:

1. An array substrate, comprising:
a substrate;
a photosensitive element, disposed on the substrate and comprising a doped semiconductor layer made of polysilicon, an intrinsic semiconductor layer made of amorphous silicon, and a transparent electrode layer sequentially stacked;
a first insulating layer, disposed on a side of the doped semiconductor layer facing away from the substrate, extending to the substrate, and provided with a first via hole; and
a second insulating layer, disposed on a side of the intrinsic semiconductor layer facing away from the substrate, extending to the first insulating layer, and provided with a second via hole,
wherein the intrinsic semiconductor layer is disposed on a side of the first insulating layer away from the substrate and is connected to the doped semiconductor through the first via hole, and the transparent electrode layer is disposed on a side of the second insulating layer away from the doped semiconductor layer and is connected to the intrinsic semiconductor layer through the second via hole; and
wherein the doped semiconductor layer is an N-type doped semiconductor, and the transparent electrode layer is a P-type transparent electrode, or the doped semiconductor layer is a P-type doped semiconductor, and the transparent electrode layer is an N-type transparent electrode.

2. The array substrate of claim 1, wherein the transparent electrode layer has a thickness between 500 angstroms (Å) and 800 Å.

3. The array substrate of claim 1, wherein the transparent electrode layer is made of metal oxide.

4. The array substrate of claim 1, wherein a light shielding layer and a buffer layer are disposed between the substrate and the doped semiconductor layer, wherein the light shielding layer is disposed on a side surface of the substrate and partially covers the substrate, the buffer layer is disposed on a side of the light shielding layer away from the substrate and extends to the substrate, and the photosensitive element is disposed on a side of the buffer layer away from the substrate and is located in an area within an orthographic projection off the light shielding layer on the substrate.

5. The array substrate of claim 4, wherein the buffer layer comprises a silicon nitrogen layer and a silicon oxygen layer sequentially stacked, or a combination thereof.

6. The array substrate of claim 1, further comprising a metal layer configured in a same layer as the transparent electrode layer, wherein a third via hole is further defined in the first insulating layer and the second insulating layer, and the metal layer is connected to the doped semiconductor layer through the third via hole.

7. The array substrate of claim 1, wherein the doped semiconductor layer has a thickness between 400 Å and 600 Å.

8. The array substrate of claim 1, wherein the intrinsic semiconductor layer has a thickness between 1000 Å and 7000 Å.

9. The array substrate of claim 1, wherein the doped semiconductor layer has a Fermi level between 4.2 and 4.7, the intrinsic semiconductor layer has a Fermi level between 4.6 and 5.0, and the transparent electrode layer has a Fermi level between 4.9 and 5.5.

10. The array substrate of claim 1, wherein the doped semiconductor layer has a refractive index between 3.8 and 4.2, the intrinsic semiconductor layer has a refractive index between 3.6 and 4.1, and the transparent electrode layer has a refractive index between 1.6 and 2.0.

11. A display panel, comprising an array substrate, wherein the array substrate comprises:
a substrate;
a photosensitive element, disposed on the substrate and comprising a doped semiconductor layer made of polysilicon, an intrinsic semiconductor layer made of amorphous silicon, and a transparent electrode layer sequentially stacked;
a first insulating layer, disposed on a side of the doped semiconductor layer facing away from the substrate, extending to the substrate, and provided with a first via hole; and
a second insulating layer, disposed on a side of the intrinsic semiconductor layer facing away from the substrate, extending to the first insulating layer, and provided with a second via hole, wherein the intrinsic semiconductor layer is disposed on a side of the first insulating layer away from the substrate and is connected to the doped semiconductor through the first via hole, and the transparent electrode layer is disposed on a side of the second insulating layer away from the doped semiconductor layer and is connected to the intrinsic semiconductor layer through the second via hole; and wherein the doped semiconductor layer is an N-type doped semiconductor, and the transparent electrode layer is a P-type transparent electrode, or the doped semiconductor layer is a P-type doped semiconductor, and the transparent electrode layer is an N-type transparent electrode.

12. The display panel of claim 11, wherein the transparent electrode layer has a thickness between 500 angstroms (Å) and 800 Å.

13. The display panel of claim 11, wherein the doped semiconductor layer has a Fermi level between 4.2 and 4.7, the intrinsic semiconductor layer has a Fermi level between 4.6 and 5.0, and the transparent electrode layer has a Fermi level between 4.9 and 5.5.

14. The display panel of claim 11, further comprising an opposite substrate and a liquid crystal layer, wherein the opposite substrate is disposed opposite to the array substrate, and the liquid crystal layer is disposed between the array substrate and the opposite substrate.

15. The display panel of claim 14, wherein the array substrate comprises the substrate, a light shieling layer, a buffer layer, the doped semiconductor layer, an active layer configured in a same layer as the doped semiconductor layer, the first insulating layer, a gate electrode layer, the second insulating layer, the intrinsic semiconductor layer, a third insulating layer, a source/drain wiring, a planarization layer, a passivation layer, the transparent electrode layer, and a first electrode layer configured in a same layer as the transparent electrode layer all sequentially disposed in a stacked arrangement.

16. The display panel of claim 11, wherein further comprising a metal layer configured in a same layer as the transparent electrode layer, wherein a third via hole is further defined in the first insulating layer and the second insulating layer, and the metal layer is connected to the doped semiconductor layer through the third via hole.

17. An array substrate, comprising:
a substrate;
a photosensitive element disposed on the substrate and comprising a doped semiconductor layer made of amorphous silicon, an intrinsic semiconductor layer made of amorphous silicon, and a transparent electrode layer sequentially stacked; and
a first insulating layer, disposed on a side of the intrinsic semiconductor layer facing away from the substrate, extending to the substrate, and provided with a first via hole,
wherein the doped semiconductor layer is disposed on the substrate, the intrinsic semiconductor layer is disposed on a side of the doped semiconductor layer facing away from the substrate, the transparent electrode layer is disposed on a side of the first insulating layer facing away from the intrinsic semiconductor layer and is connected to the intrinsic semiconductor layer through the first via hole; and
wherein the doped semiconductor layer is an N-type doped semiconductor, and the transparent electrode layer is a P-type transparent electrode, or the doped semiconductor layer is a P-type doped semiconductor, and the transparent electrode layer is an N-type transparent electrode.

18. The array substrate of claim 17, further comprising a metal layer, wherein a second via hole is defined in the first insulating layer, and the metal layer is configured in a same layer as the transparent electrode layer and is connected to the doped semiconductor layer through the second via hole.

19. The array substrate of claim 17, wherein a light shielding layer and a buffer layer are disposed between the substrate and the doped semiconductor layer, wherein the light shielding layer is disposed on a side surface of the substrate and partially covers the substrate, the buffer layer is disposed on a side of the light shielding layer away from the substrate and extends to the substrate, and the photosensitive element is disposed on a side of the buffer layer away from the substrate and is located in an area within an orthographic projection off the light shielding layer on the substrate.

20. The array substrate of claim 19, wherein the buffer layer comprises a silicon nitrogen layer and a silicon oxygen layer sequentially stacked, or a combination thereof.

* * * * *